(12) United States Patent
Igarashi et al.

(10) Patent No.: US 6,683,336 B1
(45) Date of Patent: Jan. 27, 2004

(54) SEMICONDUCTOR INTEGRATED CIRCUIT, SUPPLY METHOD FOR SUPPLYING MULTIPLE SUPPLY VOLTAGES IN SEMICONDUCTOR INTEGRATED CIRCUIT, AND RECORD MEDIUM FOR STORING PROGRAM OF SUPPLY METHOD FOR SUPPLYING MULTIPLE SUPPLY VOLTAGES IN SEMICONDUCTOR INTEGRATED CIRCUIT

(75) Inventors: Mutsunori Igarashi, Kanagawa-ken (JP); Hiroshi Tanaka, Tokyo (JP); Kimiyoshi Usami, Kanagawa-ken (JP); Takashi Ishikawa, Kanagawa-ken (JP); Masahiro Kanazawa, Kanagawa-ken (JP); Chiharu Mizuno, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 417 days.

(21) Appl. No.: 09/609,408

(22) Filed: Jul. 3, 2000

Related U.S. Application Data

(62) Division of application No. 08/996,998, filed on Dec. 23, 1997, now Pat. No. 6,097,043.

(30) Foreign Application Priority Data

Dec. 27, 1996 (JP) .......................... P8-351611

(51) Int. Cl.⁷ .............................................. H01L 27/10
(52) U.S. Cl. ................................................... 257/207
(58) Field of Search ................................ 257/207, 204, 257/205, 208, 390 E, 368, 235, 236, 238

(56) References Cited

U.S. PATENT DOCUMENTS

| 5,008,728 | A | | 4/1991 | Yamamura et al. ........... 357/45 |
| 5,293,559 | A | | 3/1994 | Kim et al. ..................... 365/63 |
| 5,300,798 | A | | 4/1994 | Yamazaki et al. .......... 257/207 |
| 5,311,048 | A | | 5/1994 | Takahashi et al. .......... 257/207 |
| 5,387,809 | A | | 2/1995 | Yamagishi et al. ......... 257/203 |
| 5,537,328 | A | | 7/1996 | Ito ............................. 364/489 |
| 5,635,737 | A | * | 6/1997 | Yin ............................. 257/204 |
| 5,780,881 | A | | 7/1998 | Matsuda et al. ............ 257/202 |
| 5,920,089 | A | | 7/1999 | Kanazawa et al. ......... 257/202 |
| 5,982,940 | A | * | 11/1999 | Sawada ...................... 382/260 |
| 6,307,162 | B1 | * | 10/2001 | Masters et al. ............. 174/262 |

* cited by examiner

*Primary Examiner*—Wael Fahmy
*Assistant Examiner*—Dana Farahani
(74) *Attorney, Agent, or Firm*—Foley & Lardner

(57) ABSTRACT

A semiconductor integrated circuit, a supply method of supplying multiple supply voltages therefor, and a record medium for storing a program of the supply method for supplying multiple voltages therefor in which a first cell to which multiple supply voltages are supplied is extracted (Step S1), the extracted cells are divided into groups (Step S2), cells for voltage supply are added and arranged according to the number of the groups (Step S3), and the cell for the voltage supply are connected to the first cell for supplying the plurality of voltages through a net for a power source supply (Step S4).

2 Claims, 13 Drawing Sheets

CELL ROW
OR
CELL COLUMN

CELL ROW
OR
CELL COLUMN

CELL ROW
OR
CELL COLUMN

CELL ROW
OR
CELL COLUMN

VDDL  VDDH

CELL ROW
OR
CELL COLUMN

CELL ROW
OR
CELL COLUMN

LEVEL CONVERTER

SEMICONDUCTOR INTEGRATED CIRCUIT, SUPPLY METHOD FOR SUPPLYING MULTIPLE SUPPLY VOLTAGES IN SEMICONDUCTOR INTEGRATED CIRCUIT, AND RECORD MEDIUM FOR STORING PROGRAM OF SUPPLY METHOD FOR SUPPLYING MULTIPLE SUPPLY VOLTAGES IN SEMICONDUCTOR INTEGRATED CIRCUIT

This application is a divisional of application Ser. No. 08/996,998, filed Dec. 23, 1997 now U.S. Pat. No. 6,097,043.

BACKGROUND OF THE INVENTION

1. Field of the Invention

The present invention relates to a semiconductor integrated circuit, a supply method for supplying multiple supply voltages to cells in the semiconductor integrated circuit, and a record medium for storing a supply program of multiple supply voltages in a semiconductor integrated circuit, and more particularly, it relates to the technology capable of integrating the semiconductor integrated circuit with a high density that operates under the multiple supply voltages.

2. Description of the Prior Art

FIG. 15 is a block diagram showing a configuration of a conventional semiconductor integrated circuit. This block diagram shows a part of the conventional semiconductor integrated circuit. In this conventional semiconductor integrated circuit, a plurality of cells 3 are arranged or placed per cell row or per cell column. In each cell row or cell column, a plurality of electrical wires such as an electrical wire 5 for a low supply voltage VDDL, an electrical wire 7 for a high supply voltage VDDH, and an electrical wire for a ground source (not shown) are formed according to demand.

Each cell 3 receives a voltage or voltages from the supply voltage VDDL, or the supply voltage VDDH, or both of them through the electrical wires 5 and 7 in order to perform operation. Accordingly, the conventional semiconductor integrated circuit has the configuration in which the electrical wires 5 and 7 are formed on a cell column even if this cell column requires only one supply voltage.

FIG. 16 is a circuit diagram showing a general configuration of a cell of a level converter (LC) for converting the voltage potential of a signal. In general, this cell of the LC requires multiple supply voltages. The level converter LC shown in FIG. 16 has an N well region 59. Two P channel type transistors are formed and connected on the N well region 59. The drain of each P channel type transistor is connected to each N channel type transistor. Furthermore, both the electrical wire 5 of the low supply voltage VDDL and the electrical wire 7 of the high supply voltage VDDH are formed on the N well region 59. A power supply section 61 for the N well region 59 is connected to the electrical wire 7 of the high supply voltage VDDH. Thus, the high voltage may be supplied to the N well region 59 through the power supply section 61.

In the conventional semiconductor integrated circuit, it is required to have the configuration in which a plurality of electrical wires are formed in each cell column in advance or to manually design the electrical wires in order to supply desired supply voltages to a target cell, arranged in the cell column, such as the level converter LC that requires the multiple supply voltages.

However, because it takes long time to manually design the electrical wires and requires a lot of design work for designers, it is difficult to design a large integrated semiconductor chip manually. Furthermore, the area of a cell is increased when a plurality of electrical wires for supply voltages are formed on each cell column, because a width or a diameter of each of the plurality of electrical wires for the supply voltages is larger than that of a normal signal wire for transferring signals. This causes to increase the area of the semiconductor chip of a semiconductor integrated circuit.

SUMMARY OF THE INVENTION

Accordingly, an object of the present invention is, with due consideration to the drawbacks of the conventional semiconductor integrated circuit, to provide a semiconductor integrated circuit, a supply method for supplying multiple supply voltages in the semiconductor integrated circuit, and a record medium for storing a supply program of multiple supply voltages in the semiconductor integrated circuit that are capable of preventing the increasing of the area of the semiconductor integrated circuit including cells requiring the multiple supply voltages in operation and capable of performing electrical wiring process in the semiconductor integrated circuit.

In accordance with a preferred embodiment of the present invention, a semiconductor integrated circuit comprises a plurality of modules comprising a plurality of cells including first cells operating under a plurality of voltages, and the plurality of cells in the plurality of modules are arranged in a plurality of cell rows or cell columns, and a wiring formed on each cell row or each cell column for supplying one supply voltage in the plurality of voltages, and one supply voltage is supplying to the plurality of cells through the wiring. In the semiconductor integrated circuit, other voltage in the plurality of supply voltages is supplied to each of the first cells through a net for power source supply.

In accordance with another preferred embodiment of the present invention, a semiconductor integrated circuit comprises a plurality of modules comprising a plurality of cells including first cells operating under a plurality of voltages, and the plurality of cells in the plurality of modules are arranged in a plurality of cell rows or cell columns, a first wiring formed on each cell row or each cell column for supplying one supply voltage in the plurality of voltages, and one supply voltage is supplied to each of the first cells in the plurality of cells through the first wiring, and a second wiring for supplying other voltage in the plurality of voltages to each of the first cells through a net for power source supply.

In the semiconductor integrated circuit as another preferred embodiment of the present invention, each first cell operating under the plurality of supply voltages is arranged in a cell row or cell column in which a wiring for supplying a high supply voltage in the plurality of supply voltages is formed.

In the semiconductor integrated circuit as another preferred embodiment of the present invention, each of the first cells to which the plurality of supply voltages are supplied is a level converter.

In the semiconductor integrated circuit as another preferred embodiment of the present invention, the level converter comprise an N well to which one voltage in the plurality of voltages is supplied through the wiring of the power source, a first P channel type MOS transistor formed on the N well and whose source is connected to the wiring, a second P channel type MOS transistor formed on the N well, whose source is connected to the wiring of the power source, whose gate is connected to a drain of the first P channel type MOS transistor, and whose drain is connected to a gate of the P channel type MOS transistor, a third P channel type MOS transistor formed on the N well and whose source is connected to a net for the power source supply, a first N channel type MOS transistor whose source is connected to the drain of the first P channel type MOS transistor, whose gate is connected to the drain of the third P channel MOS transistor, and whose drain is connected to a ground wiring, a second N channel type MOS transistor whose source is connected to the drain of the second P channel type MOS transistor, whose gate is connected to the gate of the P channel type MOS transistor, and whose drain is connected to the ground wiring, and a third N channel type MOS transistor whose source is connected to the drain of the third P channel type MOS transistor, whose gate is connected to the third P channel type MOS transistor, and whose drain is connected to the ground wiring.

In the semiconductor integrated circuit as another preferred embodiment of the present invention, the level converter comprises a first N well to which one voltage in the plurality of voltages is supplied through the wiring of the power source, a second N well to which other voltage in the plurality of voltages is supplied through the net for the power source supply, a first P channel type MOS transistor formed on the first N well and whose source is connected to the wiring, a second P channel type MOS transistor formed on the first N well, whose source is connected to the wiring of the power source, whose gate is connected to a drain of the first P channel type MOS transistor, and whose drain is connected to a gate of the P channel type MOS transistor, a third P channel type MOS transistor formed on the second N well and whose source is connected to a net for the power source supply, a first N channel type MOS transistor whose source is connected to the drain of the first P channel type MOS transistor, whose gate is connected to the drain of the third P channel MOS transistor, and whose drain is connected to a ground wiring, a second N channel type MOS transistor whose source is connected to the drain of the second P channel type MOS transistor, whose gate is connected to the gate of the P channel type MOS transistor, and whose drain is connected to the ground wiring, and a third N channel type MOS transistor whose source is connected to the drain of the third P channel type MOS transistor, whose gate is connected to the third P channel type MOS transistor, and whose drain is connected to the ground wiring.

In the semiconductor integrated circuit as another preferred embodiment of the present invention, the level converter comprises a first N well to which one voltage in the plurality of voltages is supplied through a first wiring of the power source, a second N well to which other voltage in the plurality of voltages is supplied through a second wiring of the power source, a first P channel type MOS transistor formed on the first N well and whose source is connected to the first wiring, a second P channel type MOS transistor formed on the first N well, whose source is connected to the first wiring of the power source, whose gate is connected to a drain of the first P channel type MOS transistor, and whose drain is connected to a gate of the P channel type MOS transistor, a third P channel type MOS transistor formed on the second N well and whose source is connected to the second wiring, a first N channel type MOS transistor whose source is connected to the drain of the first P channel type MOS transistor, whose gate is connected to the drain of the third P channel MOS transistor, and whose drain is connected to a ground wiring, a second N channel type MOS transistor whose source is connected to the drain of the second P channel type MOS transistor, whose gate is connected to the gate of the P channel type MOS transistor, and whose drain is connected to the ground wiring, and a third N channel type MOS transistor whose source is connected to the drain of the third P channel type MOS transistor, whose gate is connected to the second N channel type MOS transistor, and whose drain is connected to the ground wiring.

In accordance with a preferred embodiment of the present invention, a semiconductor integrated circuit comprises a plurality of modules comprising a plurality of cells including first cells operating under a plurality of supply voltages, and the plurality of cells in the plurality of modules are arranged in a plurality of cell rows or cell columns, a first wiring formed on each cell row or each cell column for supplying one supply voltage in the plurality of supply voltages, and one supply voltage is supplied to the plurality of cells through the first wiring, and a second wiring separated from the first wiring in parallel and formed between adjacent cell rows or adjacent cell columns. In the semiconductor integrated circuit, other supply voltage in the plurality of supply voltages is supplied to each of the first cells through the second wiring.

In accordance with a preferred embodiment of the present invention, a supply method for supplying multiple supply voltages for a semiconductor integrated circuit in which a plurality of modules comprising a plurality of cells including first cells operating under a plurality of supply voltages, and the plurality of cells in the plurality of modules are arranged in a plurality of cell rows or cell columns, comprises the steps of a step of arranging cells for voltage supply in the cell row or the cell column, and a step of connecting the cell for voltage supply with each of the first cells for supplying the plurality of supply voltages through a net for power source supply.

In accordance with a preferred embodiment of the present invention, a supply method for supplying multiple supply voltages for a semiconductor integrated circuit in which a plurality of modules comprises a plurality of cells including first cells operating under a plurality of supply voltages, and the plurality of cells in the plurality of modules are arranged in a plurality of cell row or cell columns, the supply method comprises the steps of a step of extracting cells in the plurality of cells to which the plurality of supply voltages are supplied, a step of dividing the extracted cells into groups, a step of adding cells for voltage supply according to the number of the groups, and a step of connecting the cell for voltage supply with each of the first cells for supplying the plurality of supply voltages through a net for power source supply.

In the supply method for supplying multiple supply voltages for a semiconductor integrated circuit as another preferred embodiment of the present invention, in the step of adding the cells for voltage supply according to the number of the groups, the cells for voltage supply are arranged in a position so that a wiring through which each of the cells for voltage supply to be added is connected to each of the first cells to which the plurality of voltages are supplied has a same resistance.

In accordance with a preferred embodiment of the present invention, a record medium readable by a computer system for storing a program of a supply method for supplying multiple supply voltages for a semiconductor integrated circuit in which a plurality of modules comprises a plurality of cells including first cells operating under a plurality of supply voltages and the plurality of cells in the plurality of modules are arranged in a plurality of cell rows or cell columns, and the supply method includes a process for arranging the cells for voltage supply into the cell row or the cell column requiring a desired voltage and for connecting the cells for the voltage supply with each of the first cells for supplying the plurality of supply voltages through a net for power source supply.

In accordance with a preferred embodiment of the present invention, a record medium readable by a computer system for storing a program of a supply method for supplying multiple supply voltages for a semiconductor integrated circuit in which a plurality of modules comprises a plurality of cells including first cells operating under a plurality of supply voltages and the plurality of cells in the plurality of modules are arranged in a plurality of cell rows or cell columns, and the supply method written in the program comprises the steps of a step of extracting cells in the plurality of cells to which the plurality of supply voltages are supplied, a step of dividing the extracted cells into groups, a step of adding cells for voltage supply according to the number of the groups, and a step of connecting the cell for the voltage supply with each of the first cells for supplying the plurality of supply voltages through a net for power source supply.

In the record medium readable by a computer system for storing a program of a supply method for supplying multiple supply voltages for a semiconductor integrated circuit as another preferred embodiment of the present invention, in the step of adding the cells for voltage supply according to the number of the groups, the cells for voltage supply are arranged in a position so that a length of a wiring through which each of the cells for voltage supply to be added is connected to each of the first cells to which the plurality of supply voltages becomes approximately equal.

BRIEF DESCRIPTION OF THE DRAWINGS

These and other objects, features, aspects and advantages of the present invention will become more apparent from the following detailed description or the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the semiconductor integrated circuit, the supply method for supplying multiple supply voltages in the semiconductor integrated circuit, and the record medium, for instance that are readable electrically and mechanically by a computer system, for storing a program of supply method for supplying multiple supply voltages in the semiconductor integrated circuit according to the present invention will now be described with reference to the drawings.

At first, the present invention does not limit the kinds of and the number of supply voltages to be used. The present invention may be applied to various semiconductor integrated devices with a simple expansion that will be explained in the following preferred embodiments of the present invention. Hereinafter, two supply voltages are used in the explanation of the following preferred embodiments for brevity.

A device to realize the supply method for supplying multiple supply voltages in the semiconductor integrated circuit according to the present invention is a computer system, that is commonly used, comprising a central processing unit (CPU) for performing processes, an input device including a key board, a mouse, a light pen, and a flexible disk device and the like, an external memory device such as a hard disk device, a memory device and the like, and an output device such as a display device, a printer device and the like.

Figure 14:
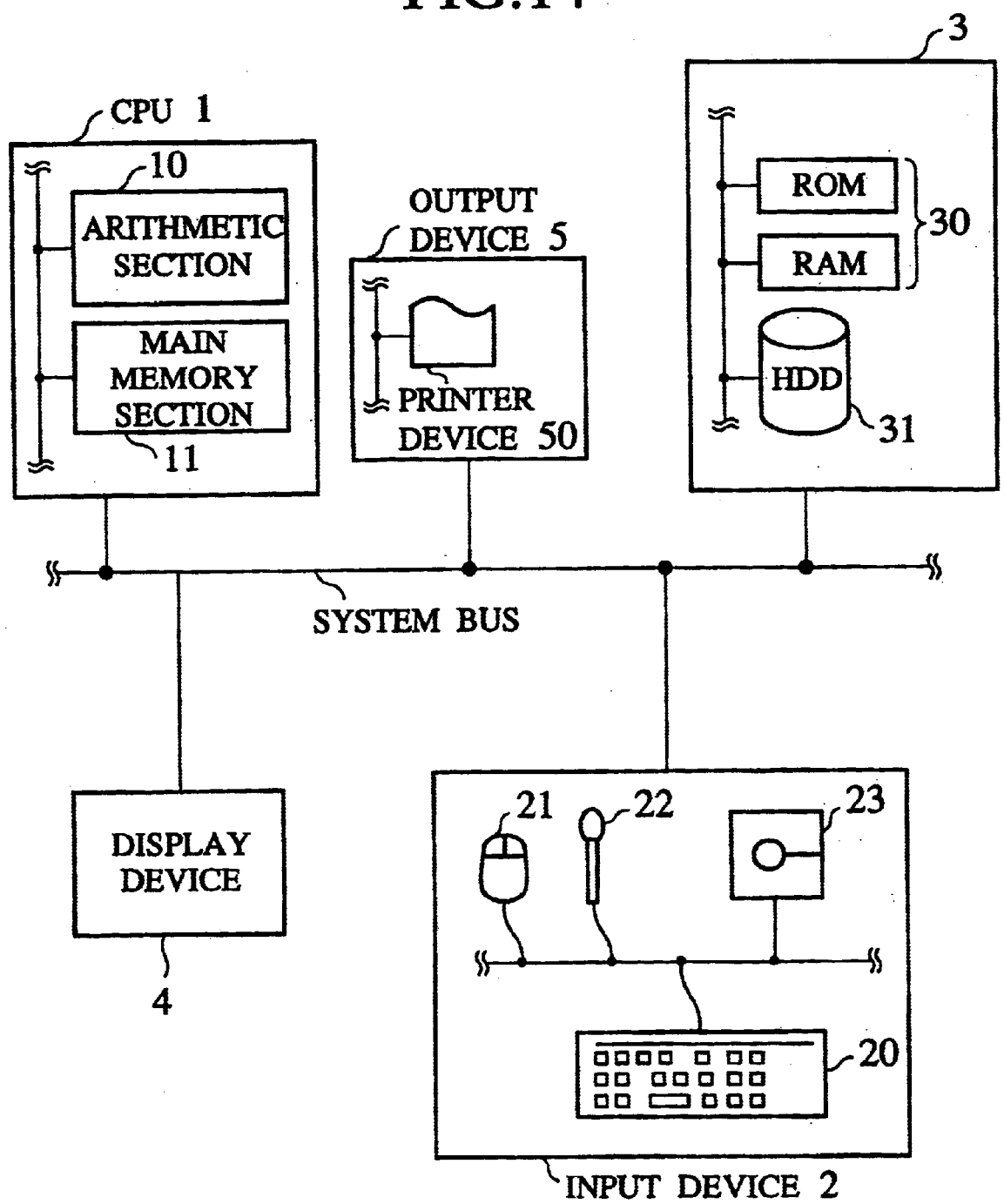
FIG. 14 is a diagram showing a design system configuration to execute the supply method for supplying multiple supply voltages in the semiconductor integrated circuit according to the present invention.

FIG. 14 is a block diagram showing the design system for executing a layout pattern generation method for semiconductor integrated circuits according to the present invention. The design system shown in FIG. 14 comprises the central processing unit (CPU) 1 for performing various processes, the input device 2 including the key board 20, the mouse 21, the light pen 22, and the flexible disk device 23 and the like, the external memory device 3 such as the hard disk device 31, the memory device 30 such as the read only memory (ROM), the random access memory (RAM) and the like, and the output device 5 such as the display device 4, the printer device 90 and the like. The CPU 1 comprises an arithmetic section for performing each step and a main memory section 11 for storing instructions of each of the steps which will be described.

First Embodiment

Figure 2:
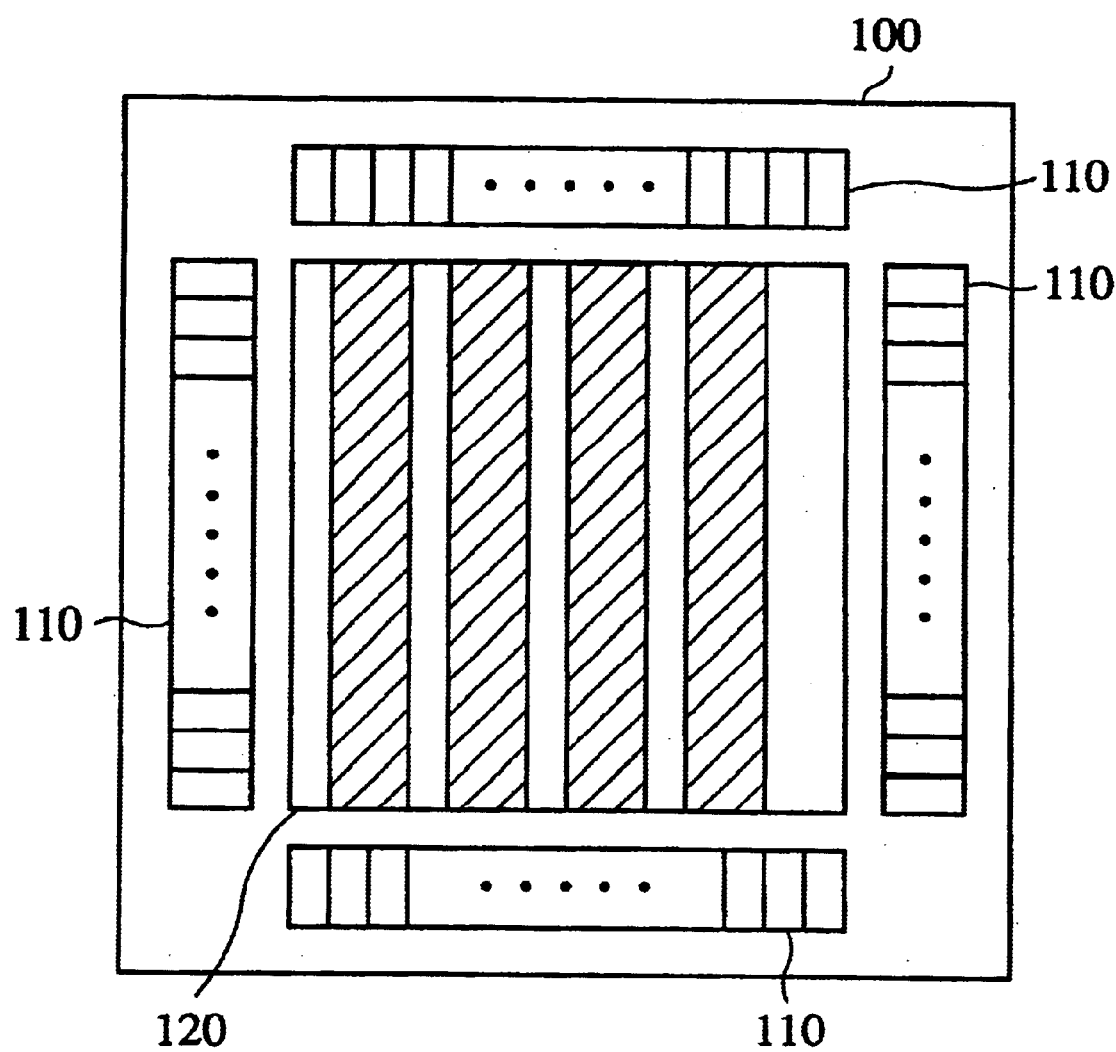
FIG. 2 is a block diagram showing a semiconductor chip of the semiconductor integrated circuit of the first embodiment according to the present invention.

FIG. 2 is a block diagram showing a LSI chip of the semiconductor integrated circuit of the first embodiment according to the present invention. The semiconductor integrated circuit 100 comprises an Input/Output (I/O) section 110 and a core section 120. Input/output cells are arranged in the I/O section 111. The core section 120 comprises wiring regions and cell columns (designated by the slant lines) in which transistors are arranged. The wiring regions and the cell regions are arranged alternately.

Figure 1:
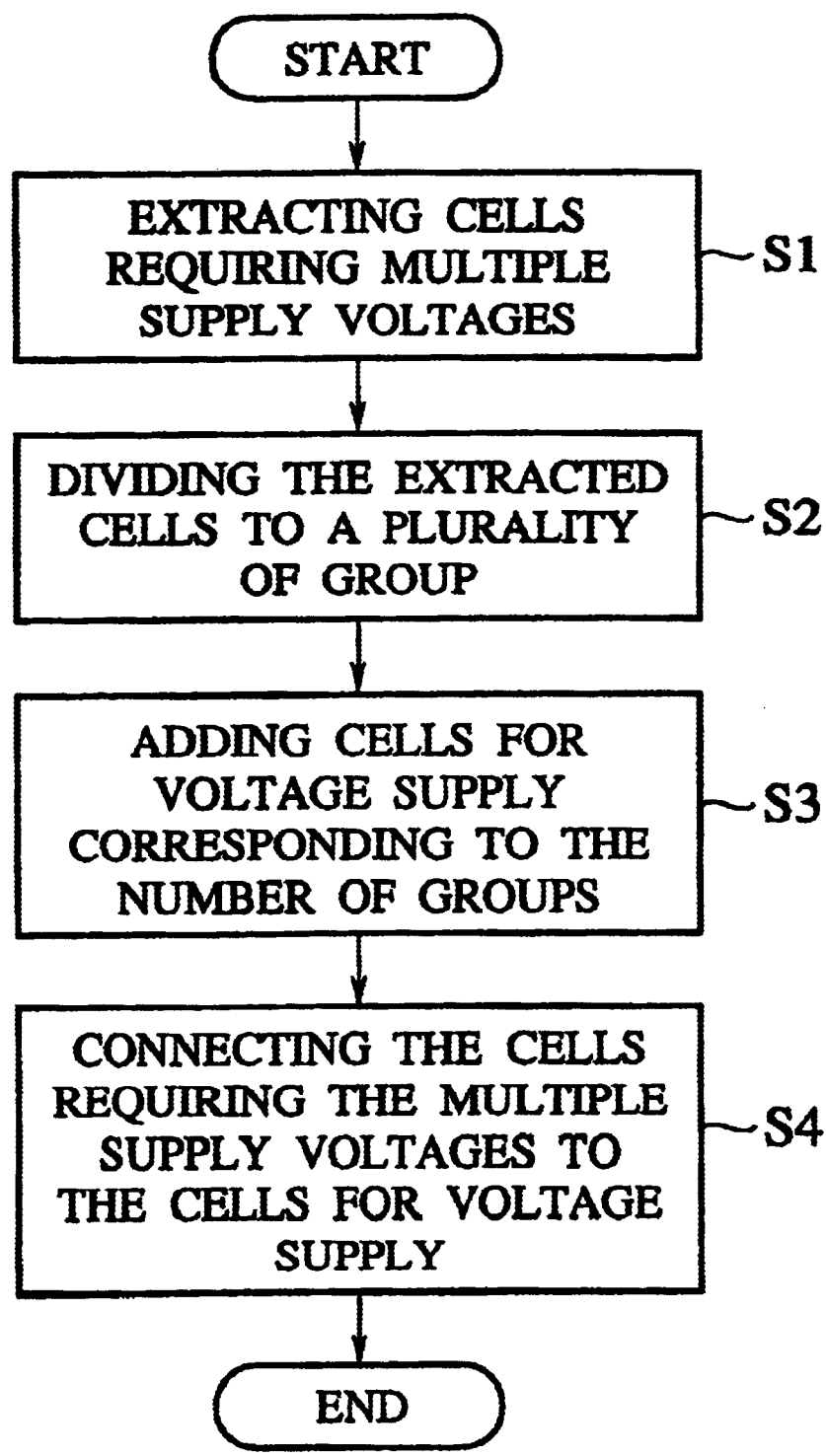
FIG. 1 is a flow chart showing a process of a supply method for supplying multiple supply voltages to a semiconductor integrated circuit as the first embodiment according to the present invention.
Figure 3:
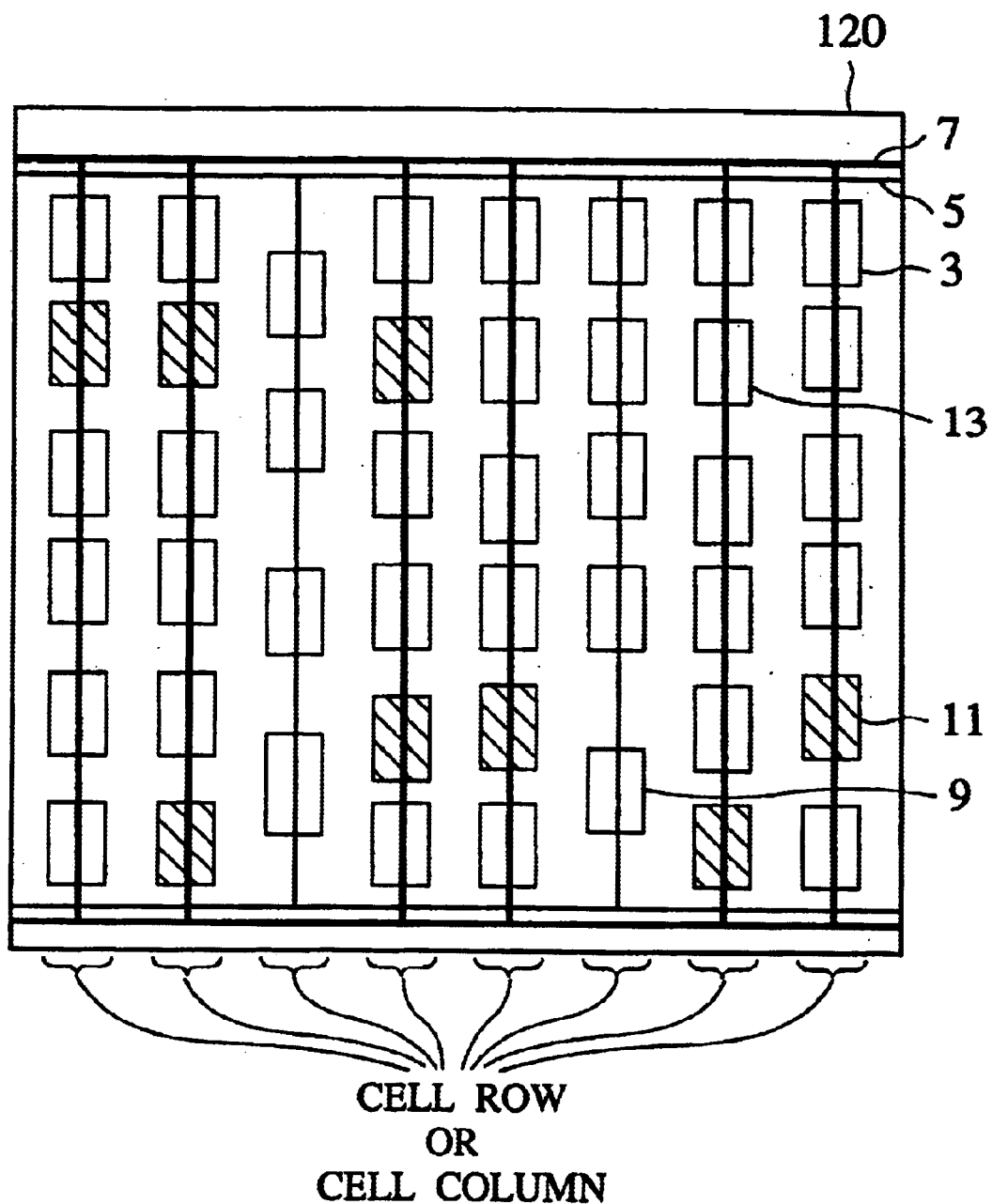
FIG. 3 is an expanded diagram showing a core section of the semiconductor integrated circuit in order to explain the operation of Step S1 in the flow chart to extract cells requiring multiple supply voltages.

FIG. 3 is an expanded diagram showing a core section of the semiconductor integrated circuit in order to explain the operation of the step S1 in the flow chart shown in FIG. 1 to extract cells requiring multiple supply voltages. The cell columns comprise cell columns (hereinafter also referred to as H columns) and cell columns (hereinafter also referred to as L columns). The wiring 7 of a high supply voltage VDDH is formed on each H column. The wiring of a low supply voltage VDDL is formed on each L column. In each H column, the high power source VDDH is supplied to each N well. In each L column, the low supply voltage VDDL of the power source is supplied to each N well. P-channel type transistors are formed on the N wells in each cell column, and N channel type transistors are formed in other areas.

Figure 15:
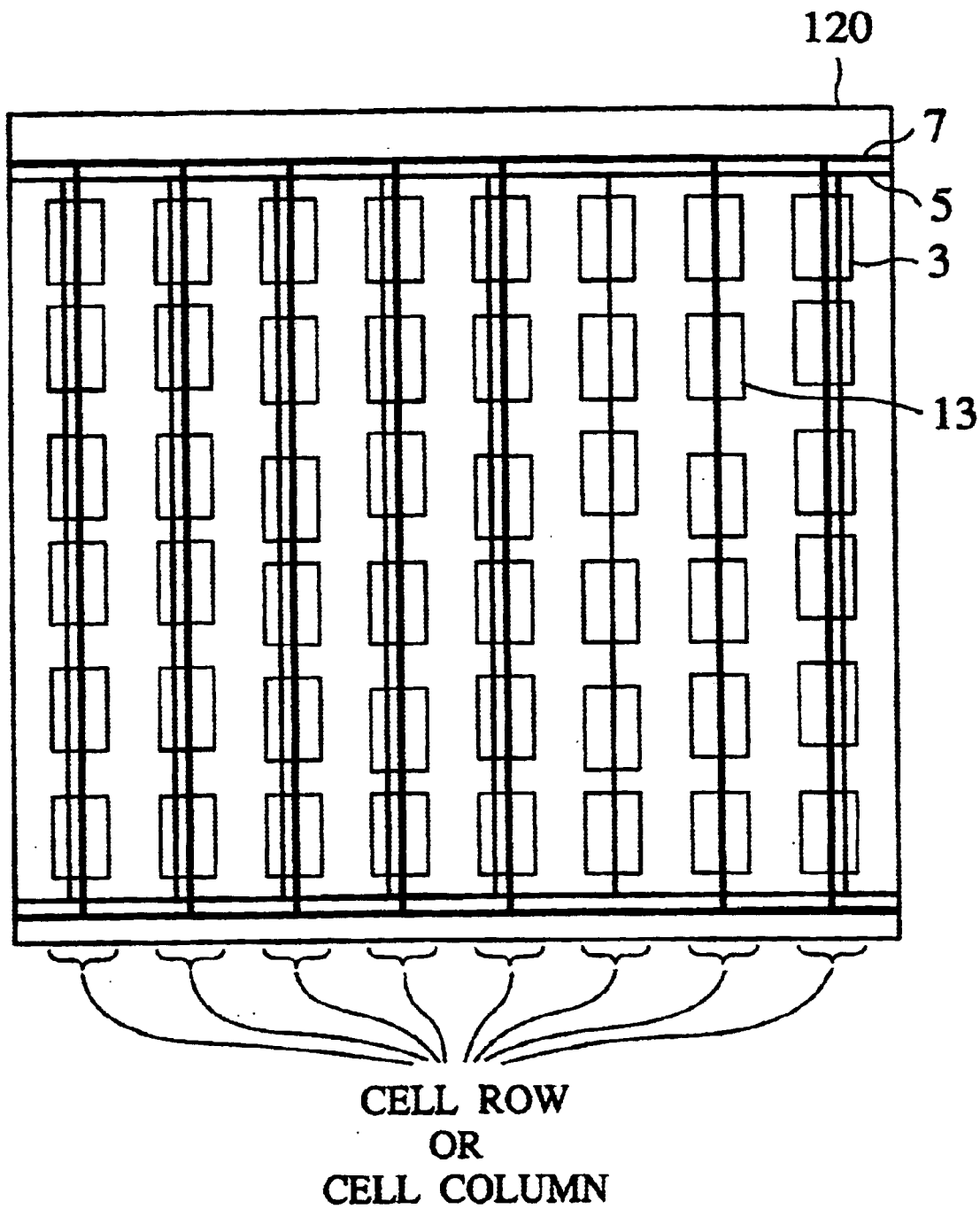
FIG. 15 is a block diagram showing a configuration of a conventional semiconductor integrated circuit.

When those cells are arranged in a plurality of cell columns, those cells are divided firstly into a column group to which the low supply voltage VDDL is supplied and a column group to which the high supply voltage VDDH of the power source is supplied. Those groups are separated electrically based on the corresponding supply voltages of the power sources. Thus, the configuration of the semiconductor integrated circuit of the first embodiment of the present invention is different from the conventional level converter shown in FIG. 15. That is, in the semiconductor integrated circuit of the first embodiment, only one electrical wiring of a supply voltage of a power source is formed on each cell column.

When an output signal is transferred from the low power cell to the high power cell, it must be required to adjust the amplitude of the output signal from the low power cell to the amplitude of a signal in the high power cell. A level converter LC is capable of performing this conversion operation between the low power cell and the high power cell. The level converter LC comprises both a transistor operating under the low supply voltage as an input section and a transistor operating under the high supply voltage as an output section.

Next, we will consider a case where the supply method for supplying multiple supply voltages according to the first embodiment is applied to a semiconductor integrated circuit. In this semiconductor integrated circuit, a level converter LC is placed on a region to which the high supply voltage VDDH is supplied.

FIG. 1 is a flow chart showing a process of a voltage supply method for supplying multiple supply voltages (hereinafter, also referred to as a multiple voltage supply method) for the semiconductor integrated circuit as the first embodiment according to the present invention.

As shown in FIG. 1, cells to which multiple supply voltages must be supplied are extracted (Step S1), and then divided into a plurality of groups (Step S2). Then, voltage supply cells are added corresponding to the number of the groups that have been divided in Step S2. Finally, the extracted cells to which multiple supply voltages are supplied are connected to the voltage supply cells through nets through which a supply voltage supply is provided (Step S4).

Next, a practical example of the supply method for supplying multiple supply voltages in the semiconductor integrated circuit as the first embodiment will be explained.

FIG. 3 is the block diagram showing the configuration of the semiconductor integrate circuit obtained by executing the supply method for supplying multiple supply voltages as the first embodiment. That is, FIG. 3 shows the core section 120 of the semiconductor integrated circuit and FIG. 3 is also used for the following explanation of the Step S1 in the flow chart shown in FIG. 1.

The cell 11 designated by the slant line in the semiconductor integrated circuit is the cell requiring the multiple voltages. In the Step S1, cells such as the cell 11 requiring the multiple voltages are extracted.

Figure 4:
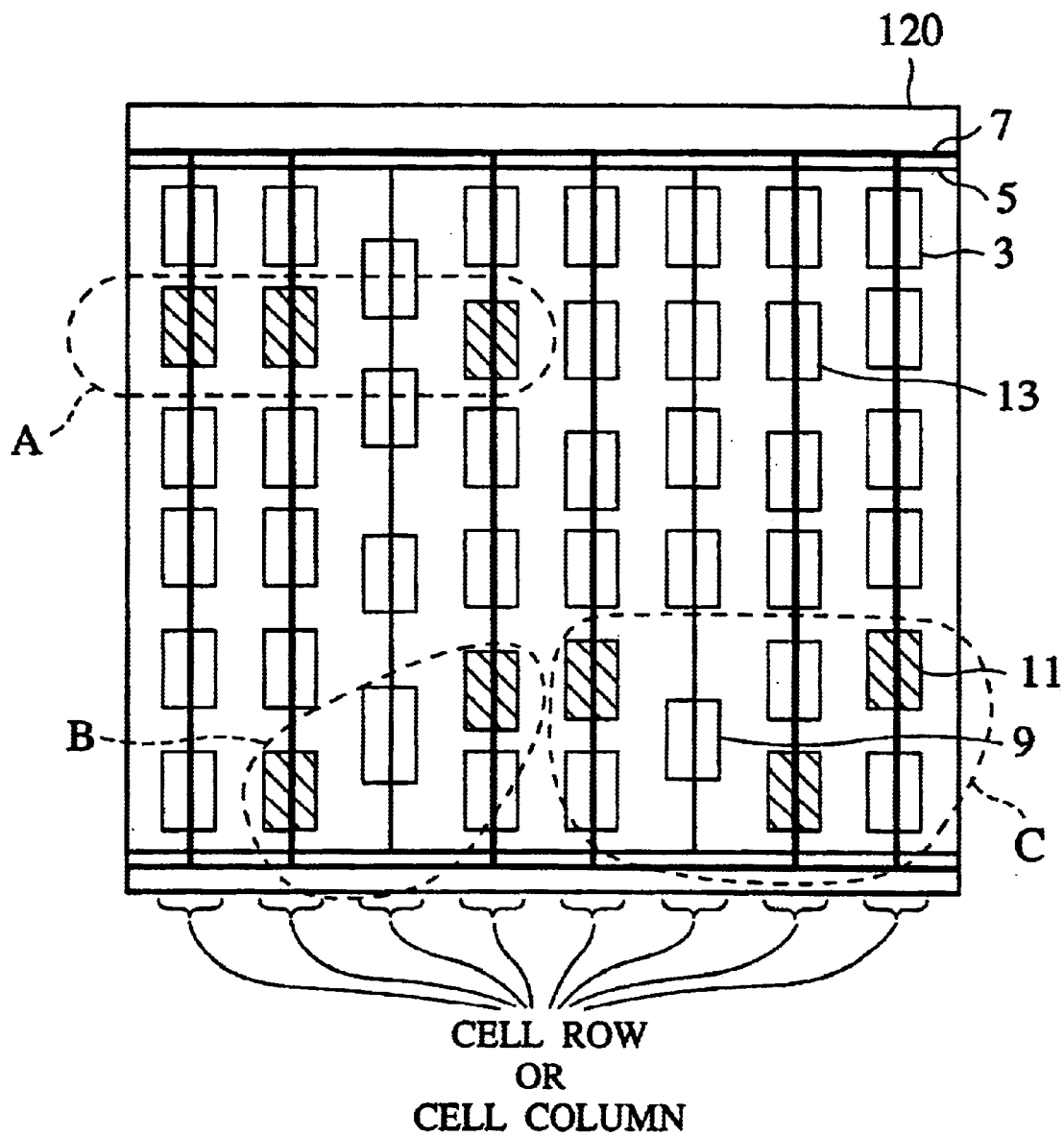
FIG. 4 is a diagram showing a core section of the semiconductor integrated circuit in order to explain the operation of Step S2 in the flow chart to divide extracted cells into many groups.

FIG. 4 is a diagram showing the core section of the semiconductor integrated circuit in order to explain the operation of the Step S2 in the flow chart to divide extracted cells into many groups.

In the Step S2, the cells that have been extracted in the step S1 are divided into a plurality of groups. In the first embodiment shown in FIG. 4, the extracted cells are divided into four groups, group A, group B, group C, and group D. In the present invention, the reason to gather level converters to which one low voltage supply cell supplies a desired voltage and the reason to arrange the gathered level converters at a limited section in a LSI chip is to avoid that the level of the low voltage supply cell from being reduced, namely to avoid the occurrence of a voltage drop caused when a plurality of level converters are connected to one low voltage supply cell.

The number of the level converters in one group or the area of a wiring section may be determined based on the magnitude of a voltage drop that is estimated by using the area of an electrical wiring, a predicted length of the electrical wiring of a net, and a resistance of the electrical wiring.

Figure 5:
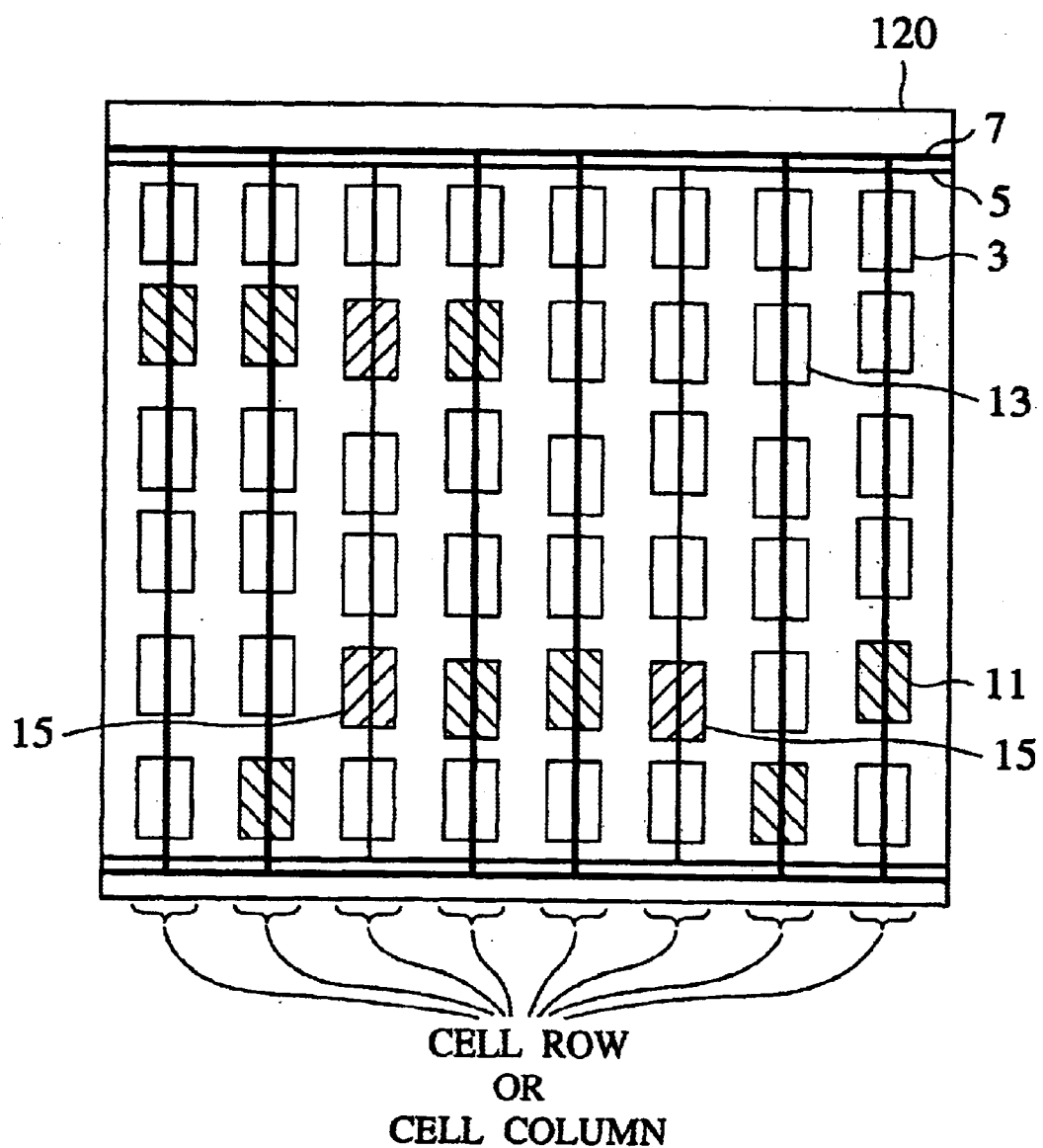
FIG. 5 is a diagram showing a core section of the semiconductor integrated circuit in order to explain the operation of Step S3 in the flow chart to add voltage supply cells according to the number of groups.

FIG. 5 is a diagram showing the core section of the semiconductor integrated circuit in order to explain the operation of the Step S3 in the flow chart to add voltage supply cells according to the number of groups.

In the Step S3, voltage supply cells are provided corresponding to the number of the groups of cells requiring a plurality of supply voltages divided in the Step S2. It is preferred to place each of the voltage supply cells near the corresponding cell group in order to reduce a resistance of wiring lines between the voltage supply cell and other cells in the group. In the example shown in FIG. 5, the voltage supply cell 15 is added (it is designated by the slant line).

Figure 6:
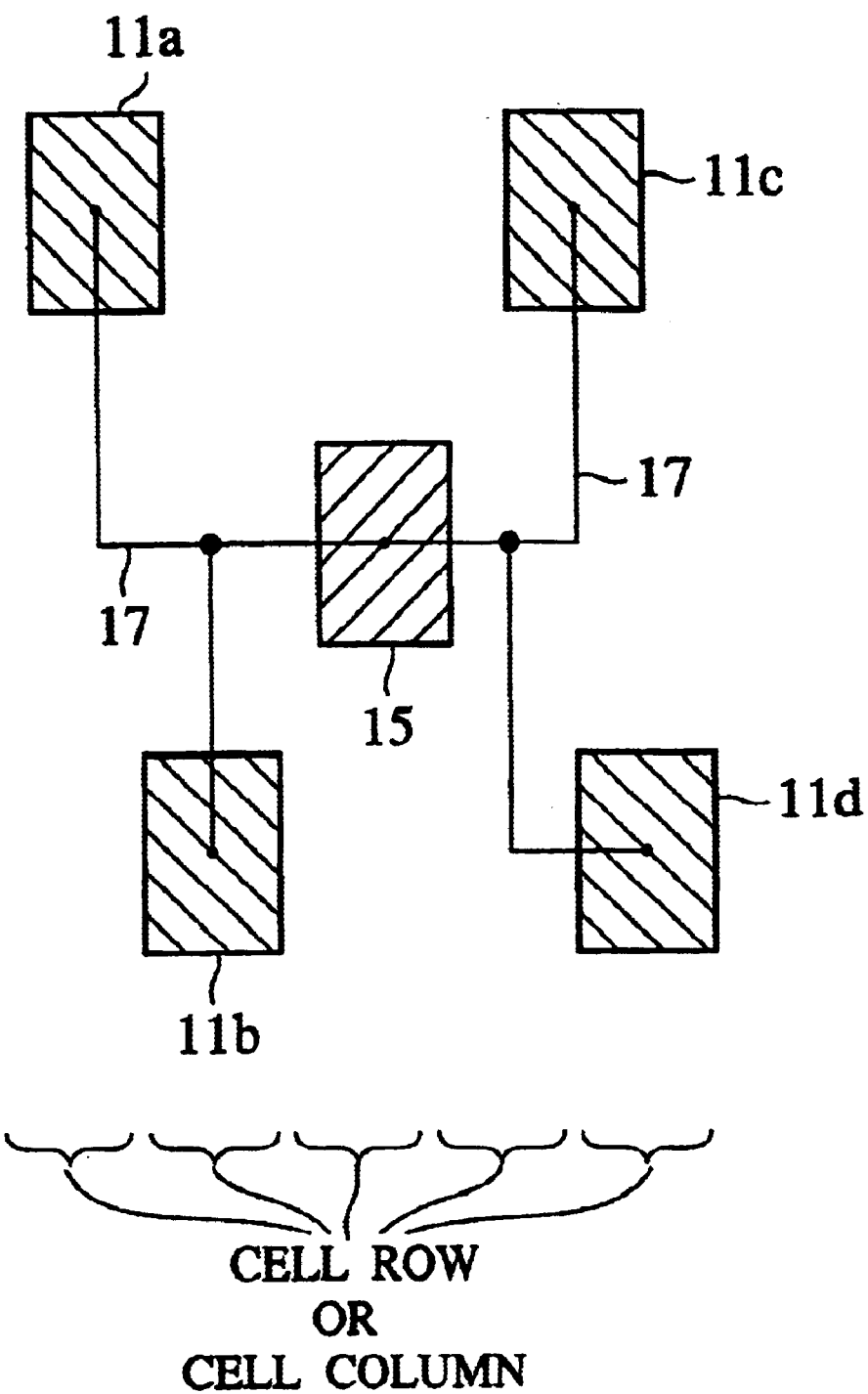
FIG. 6 is a diagram to explain the operation in detail to determine a position of a cell to be added in Step S3 in the flow chart shown in FIG. 1.

FIG. 6 is a diagram to explain the operation in detail in order to determine the position of a cell to be added in the Step S3 in the flow chart shown in FIG. 1 For example, when the cells 11a, 11b, 11c, and 11d requiring a plurality of voltages are grouped, the voltage supply cell 15 is added in order to consider the resistance of the electrical wiring among the voltage supply cell 15 and the cells 11a, 11b, 11c, and 11*d*. That is, the voltage supply cell 15 is placed so that the length of the wiring and the resistance of the wiring of each net 17 between the voltage supply cell 15 and each of the cells 11*a*, 11*b*, 11*c*, and 11*d* has the minimum value and the minimum resistance value, respectively. The value of the resistance of the wiring of each pass 17 is adjusted by changing the length of the wiring and the size of the pass 17. It is thereby possible to supply the voltage to each of the cells equally.

Figure 7:
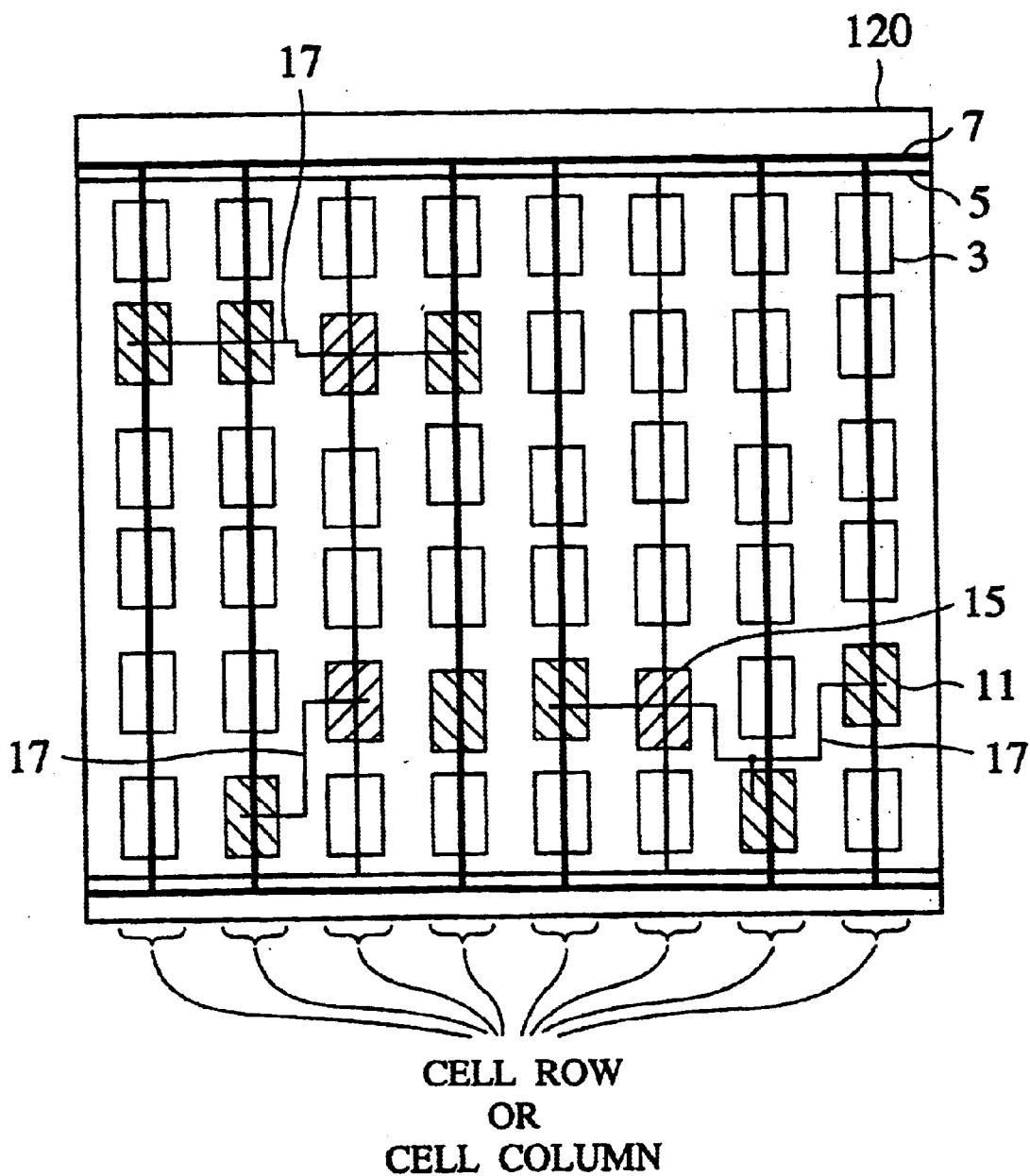
FIG. 7 is a diagram to explain the operation of Step S4 in the flow chart shown in FIG. 1 to connect a voltage supply cell for supplying a desired supply voltage with cells in a group that require the supply or the voltage.

FIG. 7 is a diagram to explain the operation of the Step S4 in the flow chart shown in FIG. 1 to connect a voltage supply cell for supplying a desired supply voltage with cells in a group that require the supply of the voltage.

In the Step S4, the voltage supply cell 15 is connected to the cells requiring the voltage. As shown in FIG. 7, in the example of the first embodiment, the voltage supply cell 15 is electrically connected to the cells 11 requiring the voltage by using the nets 17 of the voltage supply. As shown in FIG. 7, each net 17 for the voltage supply is connected from the added voltage supply cell is to each cell 17 requiring the voltage. This net 17 for the voltage supply is designed by the supply method for supplying multiple supply voltages of this embodiment. After this process, normal wiring process is performed in order to connect passes to all of the level converters in order to supply desired voltages, respectively. Thus, even if there are cells requiring a plurality of supply voltages, only one wiring of a power source is formed on each cell column. Accordingly, because the area of each cell in the semiconductor integrated circuit as the first embodiment of the present invention can be reduced when comparing with the conventional one in which one or more electrical wires of voltages of power sources are placed on each cell column, it is possible to avoid the increasing of the area of each cell and to perform the design of the wiring efficiently.

As explained above in detail, according to the semiconductor integrated circuit and the supply method for supplying multiple supply voltages therefor as the first embodiment, it is possible to solve the drawback or problems regarding the conventional supply method of multiple supply voltages of power sources that requires many handling processes in time and the increase in the area of the wiring involved in the conventional semiconductor integrated circuit and the conventional multiple voltage supply method. That is, the semiconductor integrated circuit and the supply method for supplying multiple supply voltages as the first embodiment have the following features (1) to (3);

(1) It is easily possible to design a semiconductor integrated circuit having electrical wires through which desired voltages are supplied to cells only by executing the normal automatic wiring process after voltage supply cells are added and nets are formed among the voltage supply cells and other cells requiring multiple supply voltages;

(2) It is possible to reduce the magnitude of the voltage drop of a net because cells to which one voltage supply cell supplies a supply voltage are arranged in a limited area, so that it is possible to reduce the length of wiring between the voltage supply cell and each cell arranged in the limited area; and (3) It is possible to easily supply a plurality of desired voltages to cells in each cell column that require more than two supply voltages by forming one electrical wiring, whose diameter is approximately equal to that of a normal signal line, along and on each cell column.

Second Embodiment

Next, a description will now be given of the semiconductor integrated circuit and the supply method for supplying multiple supply voltages therefor as the second embodiment.

In the supply method of the second embodiment, a wiring of a power source having a small diameter that is approximately equal to the diameter of a normal signal line is formed along and adjacent to a cell column in advance, Another wiring is also formed on the cell column and in parallel to the wiring of the power source formed along and adjacent to the cell column.

In general, in order to keep a power consumption, a wiring of a power source has a larger diameter than that of the normal signal line through which signals (not a voltage of a power source) are transferred. Therefore, as described in the explanation of the supply method and the semiconductor integrated circuit as the first embodiment, to design electrical wires of a plurality or supply voltages of power sources required for cells in a LSI chip in advance has a demerit in cell area. However, to design an electrical wire having a small diameter, that is approximately equal to the diameter of a normal signal line, in advance has a merit in cell area when the number of the electrical wires is not more, for example, approximately equal to the number of cell columns.

Figure 8:
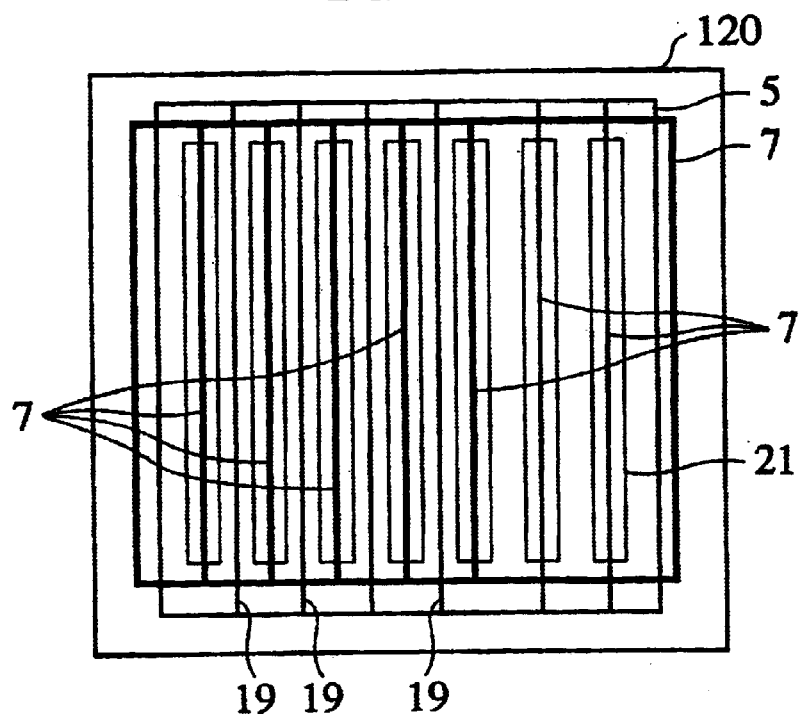
FIG. 8 is a block diagram showing a configuration of a semiconductor integrated circuit as the second embodiment according to the present invention.

FIG. 8 is a block diagram showing the configuration of the semiconductor integrated circuit as the second embodiment according to the present invention. FIG. 8 shows an example in which two supply voltages are used. In the second embodiment shown in FIG. 8, each wiring 19 for supplying a low voltage of a power source is formed corresponding to each cell column 21. That is, as shown in FIG. 8, a plurality of electrical wires for a multiple voltages are not formed on each cell column, only one wiring 7 is formed on each cell column and another wiring 19 for a low supply voltage is formed along and adjacent to each cell column. This configuration is different from the configuration of the conventional semiconductor integrated circuit.

Figure 9:
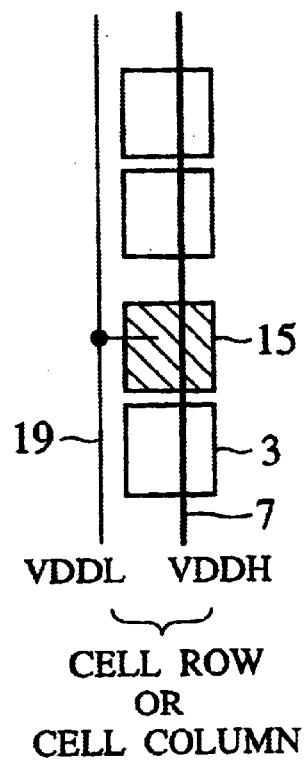
FIG. 9 is an enlarged diagram showing a cell in the semiconductor integrated circuit of the second embodiment shown in FIG. 8.

FIG. 9 is an enlarged diagram showing a part of a cell column in the semiconductor integrated circuit of the second embodiment shown in FIG. 8. When the level converter LC 15 is included in one cell column, as shown in FIG. 9, a low supply voltage VDDL of a power source is supplied to the level converter 15 through the wiring 19 formed along and adjacent to this cell column. It is possible to apply a wiring having a diameter that is approximately equal to the diameter of a normal signal line to a cell when the load of this cell is approximately equal to that of a level converter LC. Furthermore, to connect the wiring for a low voltage, that is formed along the cell column and formed in outside of the cell column, to the cell in the cell column can prevent the increasing of the area of each cell.

As described above in detail, according to the semiconductor integrated circuit and the supply method for supplying multiple supply voltages therefor as the second embodiment, because the wiring for supplying a low supply voltage of a power source whose diameter is approximately equal to that of a normal signal line is formed along and adjacent to each cell column, it is possible to supply easily the desired supply voltage through the wiring having a relatively short length.

Third Embodiment

Next, a description will now be given of the semiconductor integrated circuit and the supply method for supplying multiple supply voltages therefor as the third embodiment. In the third embodiment, a level converter LC is used as a cell requiring multiple supply voltages of power sources. Hereinafter, the third embodiment regarding the use of the level converter LC will now be explained in detail.

Figure 10:
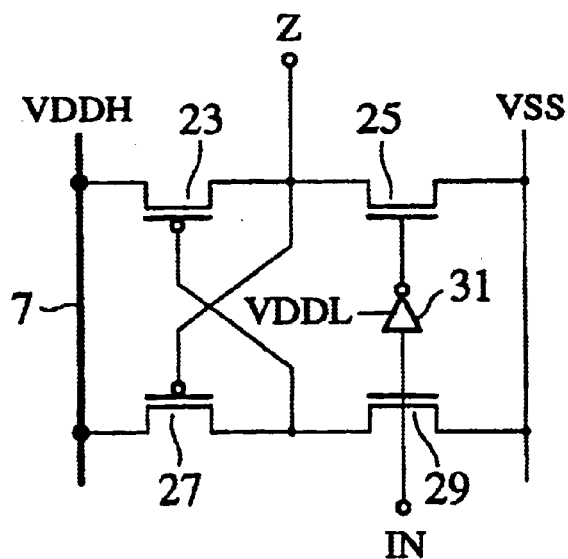
FIG. 10 is a diagram showing a configuration of a level converter LC to be used in the semiconductor integrated circuit according to the present invention.

FIG. 10 is a diagram showing the configuration of the level converter LC to be used in the semiconductor integrated circuit according to the present invention.

When an output signal from a low voltage cell is inputted to the high voltage cell. It must be required to adjust the amplitude of the signal of the low voltage cell with the amplitude of the signal of the high voltage cell. The level converter LC is capable of performing this adjustment operation for the amplitude of both signals. Accordingly, in general, as shown in FIG. 10, the level converter LC must input both the high supply voltage VDDH and the low supply voltage VDDL. Further, it is required that the level converter LC comprises four transistors 23, 25, 27, and 29 for the high supply voltage and the inverter 31 for the low supply voltage.

Here, a description will now be given of the first configuration of the level converter LC as the third embodiment.

Figure 11:
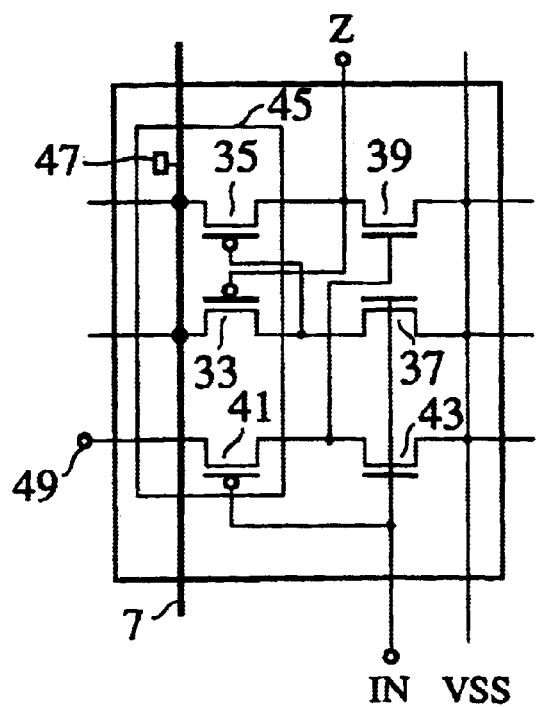
FIG. 11 is a diagram showing a configuration of a level converter LC, as a first circuit configuration, to be incorporated in the semiconductor integrated circuit of the third embodiment.

FIG. 11 is a diagram showing the configuration of the level converter LC as the first circuit configuration, to be incorporated in the semiconductor integrated circuit of the present invention.

The level converter LC comprises a wiring 7 of the high supply voltage VDDH of the power source, an N well 45 to which the supply voltage of the wiring 7 of the power source is supplied, a P channel type MOS transistor 35 formed on the N well 45, connected to the wiring 7 of the high supply voltage VDDH of the power source, a P channel MOS transistor 33 formed on the N well 45, whose source is connected to the wiring 7 of the power source, whose gate is connected to the drain of the P channel MOS transistor 35, and whose drain is connected to the gate of the P channel MOS transistor 35, a P channel MOS transistor 41 formed on the N well 45 and whose source is connected to a terminal 49 of a net for the use of the power source supply, an N channel type MOS transistor 39 whose drain is connected to the drain of the P channel MOS transistor 35, whose gate is connected to the drain of the P channel MOS transistor 41, and whose source is connected to a ground wiring VSS, an N channel MOS, transistor 37 whose drain is connected to the drain of the P channel MOS transistor 33, whose gate is connected to the gate of the P channel MOS transistor 41, and whose source is connected to the ground wiring VSS, and an N channel MOS transistor 43 whose drain is connected to the drain of the P channel MOS transistor 41, whose gate is connected to the P channel MOS transistor 41, and whose source is connected to the ground wiring VSS.

Thus, in the first circuit configuration of the level converter LC incorporated in the semiconductor integrated circuit of the present invention, P channel MOS transistors in the transistors for the high supply voltage VDDH and the inverter 31 for the low supply voltage VDDL are formed, adjacent to each other, on the N well 45 to which the high supply voltage VDDH is supplied. The source terminal 49 of the inverter 31 for the low voltage VDDL is connected to the wiring of the low supply voltage VDDL in another cell column, for example, connected by using the normal signal wiring. In the level converter LC, the terminal IN through which a signal of a low level is received and the source terminal 49 of the P channel MOS transistor are used as input terminals and the terminal Z of a high level is used as the output terminal.

Next, a description will now be given of the operation of the level converter LC having the first circuit configuration.

First, when a signal of the level 1 of the low supply Voltage (for example, 3.3 V) is inputted to the input terminal IN, the P channel MOS transistor 41 turns off, and both the N channel MOS transistors 43 and 37 turn on. Thereby, both the voltage potential of the gate of each of the N channel MOS transistor 39 and the P channel MOS transistor 35 becomes zero, so that the N channel MOS transistor 39 turns off, the P channel MOS transistor 35 turns on and the voltage potential of the gate or the P channel MOS transistor 33 turns off. Thereby, the level converter LC enters a stable state. Thus, the signal of the level 1 of the low voltage is changed to the signal of the level 1 of the high voltage. By using the same manner described above, a signal of the level 0 of the low level maybe changed to the signal of the level 1 of the high voltage, and the voltage potential (Z) of the gate becomes the level 0 of the high voltage and the level converter LC enters the stable state.

Figure 16:
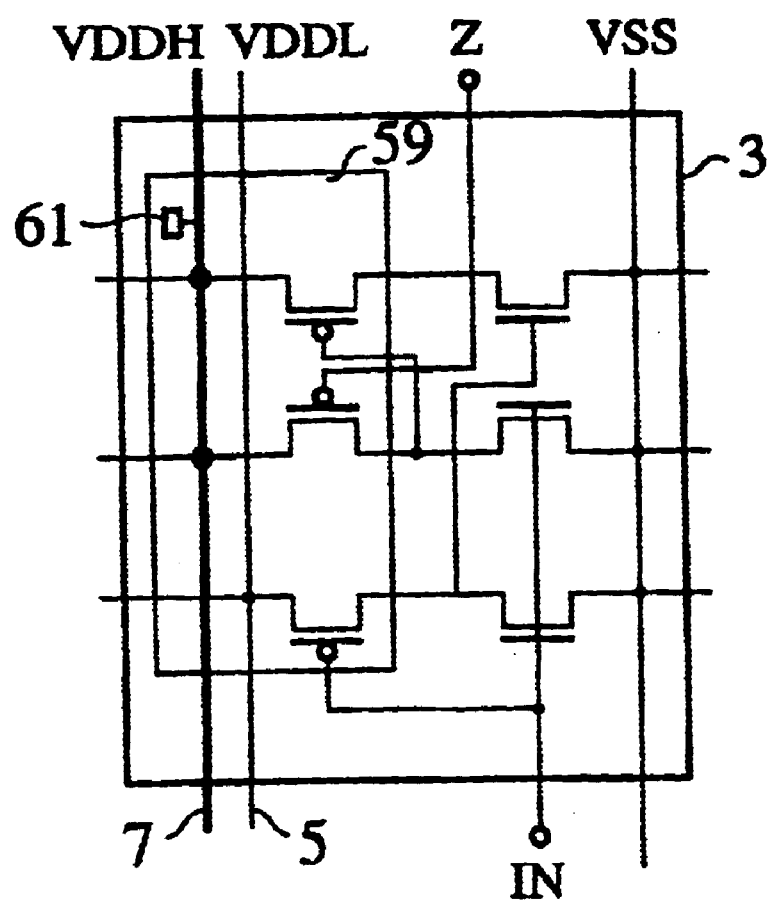
FIG. 16 is a circuit diagram showing a general configuration of a cell of a level converter LC for converting the voltage of a signal.

By using the cell configuration of the level converter LC described above, it is possible to reduce the cell area (when comparing with the conventional one shown in FIG. 16) and it is also possible to reduce the load capacitance because the number of the transistor driven by the output from the inverter 31 of the high voltage is only one (that is, the N channel MOS transistor 39). In addition to this, it is possible to connect the source terminal 49 of the level converter LC to a normal signal line whose diameter is small when comparing with the diameter of a voltage wiring. Therefore it is possible to use efficiently the wiring area in the semiconductor integrated circuit.

Next, a description will now be given of the second circuit configuration of the level converter LC.

Figure 12:
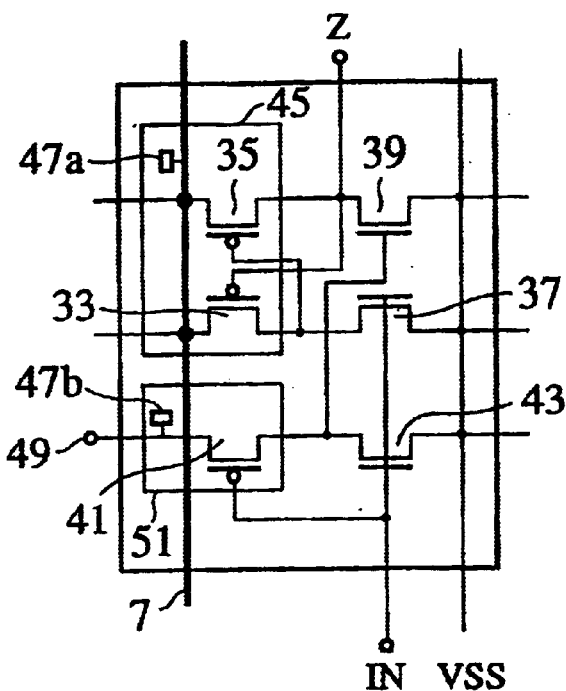
FIG. 12 is a diagram showing a configuration of a level converter LC, as a second circuit configuration, to be incorporated in the semiconductor integrated circuit of the third embodiment.

FIG. 12 is a diagram showing the configuration of the level converter LC as the second circuit configuration to be incorporated in the semiconductor integrated circuit of the third embodiment.

The level converter LC of the second circuit configuration comprises a wiring 7 of the high supply voltage VDDH of the power source, an N well 45 to which the voltage of the wiring 7 of the power source is supplied, a N well 51 to which the voltage of the terminal 49 connected to a net of the power source is supplied, a P channel MOS transistor 35 formed on the N well 45, and whose source is connected to the wiring 7 of the power source, a P channel MOS transistor 33 formed on the N well 45, whose source is connected to the wiring 7 of the power source, whose gate is connected to the drain of the P channel MOS transistor 35, and whose drain is connected to the gate of the P channel MOS transistor 35, a P channel MOS transistor 41 formed on the N well 51 and whose source is connected to a terminal 49 of a net for the use of the power source supply, an N channel type MOS transistor 39 whose drain is connected to the drain of the P channel MOS transistor 35, whose gate is connected to the drain of the P channel MOS transistor 41, and whose source is connected to a ground wiring VSS, an N channel MOS transistor 37 whose drain is connected to the drain of the P channel MOS transistor 33, whose gate is connected to the gate of the P channel MOS transistor 41, and whose source is connected to the ground wiring VSS, and an N channel MOS transistor 43 whose drain is connected to the drain of the P channel MOS transistor 41, whose gate is connected to the P channel MOS transistor 41, and whose source is connected to the ground wiring VSS.

Thus, in the second circuit configuration of the level converter LC incorporated in the semiconductor integrated circuit of the present invention. P channel MOS transistors in the transistors for the high supply voltage VDDH and the inverter for the low supply voltage VDDL are formed on the different N wells that are separated electrically from each other in a same cell column. The high supply voltage VDDH is supplied to the N well 45 and the low supply voltage VDDL is supplied to the N well 51 of the inverter of the low supply voltage VDDL. Similar to the first circuit configuration of the level converter LC shown in FIG. 11, the source terminal 49 of the inverter for the low supply voltage VDDL is connected to the wiring of the low supply voltage VDDL in another cell column, for example, connected by using the normal signal wiring. In the level converter LC, the terminal IN through which a signal of a low level is received and the source terminal 49 of the P channel MOS transistor are used as input terminals and the terminal Z of a high level is used as the output terminal.

By using the level converter LC of the second circuit configuration shown in FIG. 12 in which the N well and in which the P channel type MOS transistors in the inverter of the low supply voltage VDDL are formed is electrically separated from the N well in which the P channel type MOS transistors of the high supply voltage VDDH are formed, it is possible to increase the electrical characteristics of the inverter of the low supply voltage VDDL because the response speed of the P channel type MOS transistor in the inverter is increased, so that it is possible to provide the level converter LC having a higher response speed. When comparing with the level converter LC of the first circuit configuration shown in FIG. 11, the level converter LC of the second circuit configuration shown in FIG. 12 is capable of reducing a delay time of the response by several percentages. In addition, in order to reduce the delay time of the response, it is preferred to reduce the length of the wiring by forming electrical wires of power sources in adjacent areas.

Next, a description will now be given of the third circuit configuration of the level converter LC.

Figure 13:
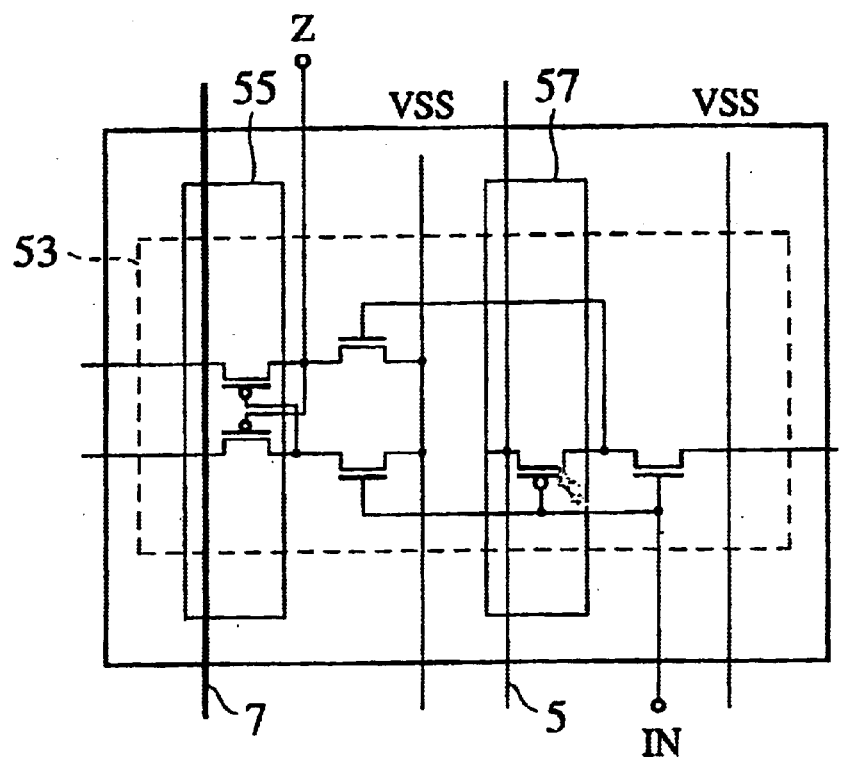
FIG. 13 is a diagram showing a configuration of a level converter LC, as a third circuit configuration, to be incorporated in the semiconductor integrated circuit of the third embodiment.

FIG. 13 is a diagram showing the configuration of the level converter LC as the third circuit configuration to be incorporated in the semiconductor integrated circuit of the present invention. In the third circuit configuration of the level converter LC, transistors of the high supply voltage VDDH are formed on high voltage cell columns 55 and the inverter of the low supply voltage VDDL is formed on the lateral cell column 57. They are arranged in parallel and adjacent to each other and occupy two cell columns in area, namely they are arranged in a two-cell column structure. Because the components of this third circuit configuration of the level converter LC is equal to that of the second circuit configuration of the level converter LC, the explanation therefor is omitted here. However, in the third circuit configuration of the level converter LC, because the wiring 5 of the low supply voltage is formed in a same cell, the low supply voltage is supplied to cells through the wiring 5 of the low supply voltage of the power source.

Because the third circuit configuration of the level converter LC has the terminal IN as an input terminal through which a signal of a low supply voltage is inputted and the terminal Z as an output terminal through which a signal of the high supply voltage is output and because P channel MOS transistors are formed on corresponding N wells, it is possible to increase a signal response of the inverter of the low supply voltage VDDL when comparing with the first circuit configuration of the level converter LC. Furthermore, the inverter of the low supply voltage is formed perpendicular to and adjacent to a cell column, it is prevented to increase the length of the wiring of the level converter LC. Moreover, it is possible to increase the response speed to a signal when comparing with the first circuit configuration of the level converter LC in which the transistor of the high supply voltage VDDH is formed separated from the inverter of the low supply voltage VDDL.

In the third embodiment of the present invention, because only one wiring for a voltage of a power source is formed on the N well, it is possible to eliminate any loss of the cell area in the semiconductor integrated circuit operable under the multiple supply voltages and it is also possible to increase the degree of integration of a semiconductor integrated circuit with a high density. In addition, the N wells for transistors of the low voltage level VDDL and the high voltage level VDDH are electrically separated from each other and each of the high supply voltage VDDH and the low supply voltage VDDL are applied to each of the N wells, respectively. It is thereby possible to improve the electrical characteristics of transistors of the low voltage level VDDL. As a result, the following effects may be obtained simultaneously; it is possible to operate the semiconductor integrated circuit under a low power source and it is possible to operate it with a high speed rate. Furthermore, it is possible to improve the electrical characteristics of the semiconductor integrated circuit by arranging cells corresponding to the voltage level of each cell column. In addition, because the transistors of the high supply voltage VDDH and the inverter of the low supply voltage VDDL are arranged in a perpendicular direction and because the length of a wiring connected between the output of the inverter of the low supply voltage VDDL and the P channel MOS transistor 39 becomes short, the magnitude of the load to be driven by the inverter of the low supply voltage VDDL becomes small. It is thereby possible to increase the response speed of the inverter of the low supply voltage VDDL. As a result, it is thereby possible to improve the electrical characteristics of transistors of the low voltage level, possible to operate the semiconductor integrated circuit under a low power sourer, and also possible to operate it with a high speed rate. As a result, it is possible to have the effects to operate the semiconductor integrated circuit under a low power source and to operate it with a high speed rate can be obtained.

Moreover, a program in order to perform the supply method for supplying the multiple supply voltages to cells it the semiconductor integrated circuit described above may be stored in a record medium. This record medium storing the program of the supply method for supplying multiple voltages is read electrically and magnetically by a computer system. Then, the program is executed by the computer system. There are memory devices, magnetic disk devices, and optical disc devices that are capable of recording programs as the record medium.

As described in detail, according to the semiconductor integrated circuit, supply method for supplying multiple supply voltages of power sources in the semiconductor integrated circuit, and the record medium to record a program of the supply method of the multiple voltages of the present invention, it is possible to avoid the increasing of the area of cells requiring a plurality of supply voltages and possible to perform the wiring operation among cells efficiently.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A semiconductor integrated circuit comprising:
   a plurality of modules comprising a plurality of cells including first cells operating under a plurality of voltages, and the plurality of cells in the plurality of modules are arranged in a plurality of cell rows or cell columns;
   a first wiring formed on each cell row and each cell column for supplying first supply voltage in the plurality of voltages, and first supply voltage is supplied to each of the first cells in the plurality of cells through the first wiring; and a second wiring for supplying second voltage in the plurality of voltages to each of the first cells through a net for power source supply;

wherein each of the first cells to which the plurality of supply voltages are supplied is a level converter;

wherein the level converter comprises:

a first N well to which first voltage in the plurality of voltages is supplied through the wiring of the power source;

a second N well to which second voltage in the plurality of voltages is supplied through the net for the power source supply;

a first P channel type MOS transistor formed on the first N Well and whose source is connected to the wiring;

a second P channel type MOS transistor formed on the first N well, whose source is connected to the wiring of the power source, whose gate is connected to a drain of the first P channel type MOS transistor, and whose drain is connected to a gate of the P channel type MOS transistor;

a third P channel type MOS transistor formed on the second N well and whose source is connected to a net for the power supply;

a first N channel type MOS transistor whose drain is connected to the drain of the first P channel type MOS transistor, whose gate is connected to the drain of the third P channel MOS transistor, and whose source is connected to a ground wiring;

a second N channel type MOS transistor whose drain is connected to the drain of the second P channel type MOS transistor, whose gate is connected to the gate of the P channel type MOS transistor, and whose source is connected to the ground wiring; and a third N channel type MOS transistor whose drain is connected to the drain of the third P channel type MOS transistor, whose gate is connected to the third P channel type MOS transistor, and whose source is connected to the ground wiring.

2. A semiconductor integrated circuit comprising:

a plurality of modules comprising a plurality of cells including first cells operating under a plurality of voltages, and the plurality of cells in the plurality of modules are arranged in a plurality of cell rows or cell columns;

a first wiring formed on each cell row and each cell column for supplying first supply voltage in the plurality of voltages, and first supply voltage is supplied to each of the first cells in the plurality of cells through the first wiring; and a second wiring for supplying second voltage in the plurality of voltages to each of the first cells through a net for power source supply;

wherein each of the first cells to which the plurality of supply voltages are supplied is a level converter;

wherein the level converter comprises:

a first N well to which first voltage in the plurality of voltages is supplied through the wiring of the power source;

a second N well to which second voltage in the plurality of voltages is supplied through a second wiring to the power source;

a first P channel type MOS transistor formed on the first N Well and whose source is connected to the first wiring;

a second P channel type MOS transistor formed on the first N well, whose source is connected to the first wiring of the power source, whose gate is connected to a drain of the first P channel type MOS transistor, and whose drain is connected to a gate of the P channel type MOS transistor;

a third P channel type MOS transistor formed on the second N well and whose source is connected to the second wiring;

a first N channel type MOS transistor whose drain is connected to the drain of the first P channel type MOS transistor, whose gate is connected to the drain of the third P channel MOS transistor, and whose source is connected to a ground wiring;

a second N channel type MOS transistor whose drain is connected to the drain of the second P channel type MOS transistor, whose gate is connected to the gate of the P channel type MOS transistor, and whose source is connected to the ground wiring; and a third N channel type MOS transistor whose drain is connected to the drain of the third P channel type MOS transistor, whose gate is connected to the second N channel type MOS transistor, and whose source is connected to the ground wiring.

* * * * *